US012693691B2

(12) United States Patent　　(10) Patent No.:　US 12,693,691 B2
Glime, III et al.　　(45) Date of Patent:　Jul. 28, 2026

(54) SYSTEMS AND METHODS FOR SYNCHRONIZED VALVE ACTUATION

(71) Applicant: Swagelok Company, Solon, OH (US)

(72) Inventors: William H. Glime, III, Chagrin Falls, OH (US); Daniel Gutmann, Burton, OH (US); Frank Horvat, Aurora, OH (US)

(73) Assignee: Swagelok Company, Solon, OH (US)

( * ) Notice: Subject to any disclaimer, the term of this patent is extended or adjusted under 35 U.S.C. 154(b) by 0 days.

(21) Appl. No.: 18/651,937

(22) Filed: May 1, 2024

(65) Prior Publication Data

US 2024/0370042 A1　Nov. 7, 2024

Related U.S. Application Data

(60) Provisional application No. 63/499,500, filed on May 2, 2023.

(51) Int. Cl.
　*G05D 7/06*　　(2006.01)
　*C23C 16/455*　　(2006.01)
　　　(Continued)

(52) U.S. Cl.
　CPC ..... *G05D 7/0623* (2013.01); *C23C 16/45525* (2013.01); *C23C 16/45561* (2013.01);
　　　(Continued)

(58) Field of Classification Search
　CPC ........ F15B 11/22; F15B 13/08; F15B 13/085; F15B 13/0853; F15B 13/0857;
　　　(Continued)

(56) References Cited

U.S. PATENT DOCUMENTS 3,225,785 A * 12/1965 Goike ....................... F22D 5/26
　　　　　　　　　　　　　91/363 R
3,777,778 A * 12/1973 Janu ........................ F16K 31/48
　　　　　　　　　　　　　137/487.5
　　　(Continued)

FOREIGN PATENT DOCUMENTS

AU　　2010257403　　8/2011
CN　　13003875　　6/2001
　　　(Continued)

OTHER PUBLICATIONS

International Search Report and Written Opinion from PCT/US2018/066124 dated May 10, 2019.

(Continued)

*Primary Examiner* — William M Mccalister
(74) *Attorney, Agent, or Firm* — Calfee, Halter & Griswold LLP

(57)　　　ABSTRACT

A valve control module includes a controller storing a real time operating system for controlling operation of the valve control module, at least one command signal input connector in circuit communication with the controller and connectable with an external device for receiving command signal pulses from the external device, at least one driver circuit in circuit communication with the controller and connectable with a pilot valve of a valve assembly for transmitting to the pilot valve actuation signal pulses generated by the controller, and at least one digital input connector in circuit communication with the controller and connectable with a position sensor of the valve assembly for receiving stroke signal pulses from the position sensor and communicating the stroke signal pulses to the controller.

20 Claims, 7 Drawing Sheets

(51) Int. Cl.

| | | |
|---|---|---|
| *C23C 16/52* | (2006.01) |
| *F15B 11/22* | (2006.01) |
| *F15B 13/08* | (2006.01) |
| *F15B 15/28* | (2006.01) |
| *F15B 19/00* | (2006.01) |
| *F15B 21/08* | (2006.01) |
| *F15B 21/10* | (2006.01) |
| *F16K 31/40* | (2006.01) |

(52) U.S. Cl.
CPC .............. *C23C 16/52* (2013.01); *F15B 11/22* (2013.01); *F15B 19/002* (2013.01); *F15B 19/005* (2013.01); *F15B 21/087* (2013.01); *F15B 21/10* (2013.01); *F16K 31/40* (2013.01); *F15B 13/08* (2013.01); *F15B 13/085* (2013.01); *F15B 13/0853* (2013.01); *F15B 15/2807* (2013.01); *F15B 2211/6336* (2013.01); *F15B 2211/6656* (2013.01); *F15B 2211/7052* (2013.01); *F15B 2211/7653* (2013.01); *F15B 2211/782* (2013.01); *F15B 2211/857* (2013.01); *F15B 2211/8855* (2013.01)

(58) Field of Classification Search
CPC .......... F15B 15/2807; F15B 2211/7052; F15B 2211/7142; F15B 2211/6336; F15B 2211/7653; F15B 2211/783; F15B 2211/857; F15B 2211/8855; F15B 19/005; F15B 21/087; F15B 21/10; G05D 7/0623; F16K 31/40; Y10T 137/7761
USPC ...................................................... 137/487.5
See application file for complete search history.

(56) References Cited

U.S. PATENT DOCUMENTS

| | | | |
|---|---|---|---|
| 4,205,592 A * | 6/1980 | Haussler .................. | F15B 21/08 91/449 |
| 4,679,583 A | 7/1987 | Lucas et al. | |
| 4,796,661 A * | 1/1989 | Hishinuma .......... | G05D 16/024 251/129.08 |
| 4,798,527 A * | 1/1989 | Gunda ................... | B29C 45/77 425/149 |
| 4,938,252 A * | 7/1990 | Piechnick .......... | G05D 16/2013 137/486 |
| 4,976,144 A | 12/1990 | Fitzgerald | |
| 5,197,328 A | 3/1993 | Fitzgerald | |
| 5,431,182 A | 7/1995 | Brown | |
| 5,549,137 A | 8/1996 | Lenz | |
| 5,573,032 A | 11/1996 | Lenz | |
| 6,026,352 A | 2/2000 | Burns | |
| 6,035,878 A | 3/2000 | Adams et al. | |
| 6,105,607 A * | 8/2000 | Caise ................... | F16K 31/402 137/487.5 |
| 6,189,563 B1 * | 2/2001 | Taylor .................. | F16K 31/406 251/30.01 |
| 6,273,401 B1 | 8/2001 | Payne | |
| 6,356,811 B1 | 3/2002 | Beselt | |
| 6,678,584 B2 | 1/2004 | Junk et al. | |
| 7,222,016 B2 | 5/2007 | Snowbarger et al. | |
| 7,299,140 B2 | 11/2007 | Liu et al. | |
| 7,744,060 B2 | 6/2010 | Sneh | |
| 7,836,780 B2 | 11/2010 | Garnett et al. | |
| 7,884,449 B2 | 2/2011 | Malolepszy et al. | |
| 7,946,117 B2 | 5/2011 | Atkinson et al. | |
| 7,992,454 B2 | 8/2011 | Purdy et al. | |
| 8,083,205 B2 | 12/2011 | Sneh | |
| 8,195,312 B2 | 6/2012 | Smirnov et al. | |
| 8,413,677 B1 | 4/2013 | Coffman | |
| 8,679,253 B2 | 3/2014 | Furuya | |
| 8,997,886 B2 | 4/2015 | Ding | |

| | | | |
|---|---|---|---|
| 9,348,339 B2 | 5/2016 | Ding et al. | |
| 9,441,453 B2 | 9/2016 | Lymberopoulos et al. | |
| 9,459,239 B2 | 10/2016 | Witt et al. | |
| 9,465,391 B2 | 10/2016 | Grumpstrup et al. | |
| 9,846,102 B2 | 12/2017 | Tharaldson et al. | |
| 9,880,564 B2 | 1/2018 | Wagner-Stuerz | |
| 9,909,682 B2 | 3/2018 | Sneh | |
| 9,921,089 B2 | 3/2018 | Ohmi et al. | |
| 10,031,531 B2 | 7/2018 | Ding | |
| 10,126,760 B2 | 11/2018 | Ding et al. | |
| 10,353,408 B2 | 7/2019 | Ding et al. | |
| 10,527,185 B2 * | 1/2020 | Ottliczky .............. | F16K 27/003 |
| 10,613,553 B2 | 4/2020 | van der Merwe et al. | |
| 10,649,471 B2 | 5/2020 | Ding et al. | |
| 10,665,430 B2 | 5/2020 | Sawachi et al. | |
| 10,725,484 B2 | 7/2020 | L'Bassi et al. | |
| 10,969,799 B2 | 4/2021 | Ding et al. | |
| 11,073,442 B2 | 7/2021 | Glime, III | |
| 11,104,997 B2 | 8/2021 | Miyashita et al. | |
| 11,162,176 B2 | 11/2021 | Yasuda et al. | |
| 11,187,346 B2 | 11/2021 | Takimoto et al. | |
| 11,242,934 B2 | 2/2022 | Kondo et al. | |
| 11,243,549 B2 | 2/2022 | Tanno et al. | |
| 11,300,983 B2 | 4/2022 | Somani et al. | |
| 11,512,993 B2 | 11/2022 | Kondo et al. | |
| 11,537,150 B2 | 12/2022 | Shakudo | |
| 11,557,492 B2 | 1/2023 | Biwa et al. | |
| 11,678,561 B2 | 6/2023 | Harjee et al. | |
| 11,709,080 B2 | 7/2023 | Cocciadiferro et al. | |
| 11,713,992 B2 | 8/2023 | Layher et al. | |
| 11,867,589 B2 | 1/2024 | Glime | |
| 11,873,916 B2 | 1/2024 | Takimoto et al. | |
| 11,969,767 B2 | 4/2024 | Zhang | |
| 12,000,723 B2 | 6/2024 | Ding | |
| 12,007,797 B2 | 6/2024 | Sugita et al. | |
| 12,072,719 B2 | 8/2024 | Staudt et al. | |
| 12,131,962 B2 | 10/2024 | Cheng et al. | |
| 12,209,679 B2 | 1/2025 | Takimoto et al. | |
| 12,259,739 B2 | 3/2025 | Nagarajan et al. | |
| 2003/0070710 A1 * | 4/2003 | Inayama ............ | G05D 16/2095 137/85 |
| 2006/0021656 A1 * | 2/2006 | Kajitani .............. | G05D 16/202 137/487.5 |
| 2006/0213561 A1 * | 9/2006 | Tiwet ..................... | G05D 7/005 137/488 |
| 2006/0219299 A1 | 10/2006 | Snowbarger | |
| 2007/0017573 A1 * | 1/2007 | Frampton ........... | F16K 37/0091 137/81.1 |
| 2008/0065355 A1 | 3/2008 | Bredau et al. | |
| 2008/0099087 A1 * | 5/2008 | Cook .................. | F16K 37/0041 137/596.17 |
| 2008/0236383 A1 | 10/2008 | Matsumoto et al. | |
| 2009/0222220 A1 | 9/2009 | Wilke | |
| 2009/0240376 A1 | 9/2009 | Elschafei | |
| 2010/0138051 A1 | 6/2010 | Glime | |
| 2012/0227983 A1 * | 9/2012 | Lymberopoulos ...... | E21B 34/10 166/373 |
| 2013/0319535 A1 * | 12/2013 | Boger ............... | G05D 16/2097 137/487.5 |
| 2013/0327426 A1 * | 12/2013 | Nomiyama ......... | F16K 37/0066 137/551 |
| 2015/0088321 A1 | 3/2015 | Schmidt | |
| 2016/0305568 A1 * | 10/2016 | Turnaus .................. | F16K 31/02 |
| 2018/0112682 A1 | 4/2018 | Valentin-Rumpel | |
| 2019/0085450 A1 | 3/2019 | Takeuchi et al. | |
| 2020/0056971 A1 | 2/2020 | Gillette et al. | |
| 2021/0172284 A1 | 6/2021 | Khorshidian et al. | |
| 2022/0196163 A1 | 6/2022 | Tsuchiguchi et al. | |
| 2022/0238325 A1 | 7/2022 | Agnew et al. | |
| 2022/0293442 A1 | 9/2022 | Kumar et al. | |
| 2024/0191813 A1 | 6/2024 | Quan et al. | |
| 2024/0209778 A1 | 6/2024 | Raju et al. | |
| 2025/0130600 A1 | 4/2025 | Mudd et al. | |

(56) References Cited

U.S. PATENT DOCUMENTS

| | | |
|---|---|---|
| 2025/0155066 A1 | 5/2025 | Beroz et al. |
| 2025/0305595 A1 | 10/2025 | Sugita et al. |

FOREIGN PATENT DOCUMENTS

| | | |
|---|---|---|
| CN | 1807862 | 7/2006 |
| CN | 1914384 | 2/2007 |
| CN | 201107611 | 8/2008 |
| CN | 101512162 | 8/2009 |
| CN | 103308288 | 9/2013 |
| CN | 103899830 | 7/2014 |
| CN | 203770808 | 8/2014 |
| CN | 104344935 | 2/2015 |
| CN | 104395615 | 3/2015 |
| CN | 204588512 | 8/2015 |
| CN | 107655669 | 2/2018 |
| DE | 102005048646 | 2/2007 |
| DE | 102015007568 | 12/2015 |
| DE | 102016201988 | 6/2017 |
| DE | 102016105881 | 10/2017 |
| EP | 2085622 | 8/2009 |
| EP | 2489993 | 8/2012 |
| EP | 2752585 | 7/2014 |
| EP | 1931962 | 8/2015 |
| EP | 2575633 | 1/2016 |
| EP | 3287680 | 2/2018 |
| FR | 2951774 | 4/2011 |
| IN | 202411035052 | 5/2024 |
| JP | H01244330 | 9/1989 |
| JP | 7534147 | 8/2024 |
| KR | 102418313 | 7/2022 |
| WO | 2017/196600 | 11/2017 |
| WO | 2025/085381 | 4/2024 |
| WO | 2025/146697 | 7/2025 |
| WO | 2025/155616 | 7/2025 |
| WO | 2025/208060 | 10/2025 |
| WO | 2025/229317 | 11/2025 |
| WO | 2025/229445 | 11/2025 |
| WO | 2025/235672 | 11/2025 |

OTHER PUBLICATIONS

Search Report and Written Opinion from Singapore Application No. 11202003892T dated Jan. 20, 2022.
Office action from Chinese Application No. 201880073733.4 dated Apr. 2, 2022.
International Search Report and Written Opinion from PCT/US2024/027129 dated Jul. 19, 2024.

* cited by examiner

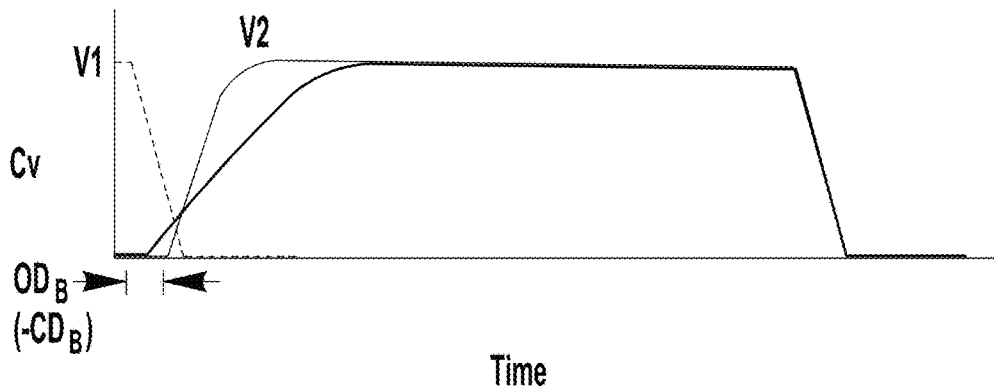
FIG. 6
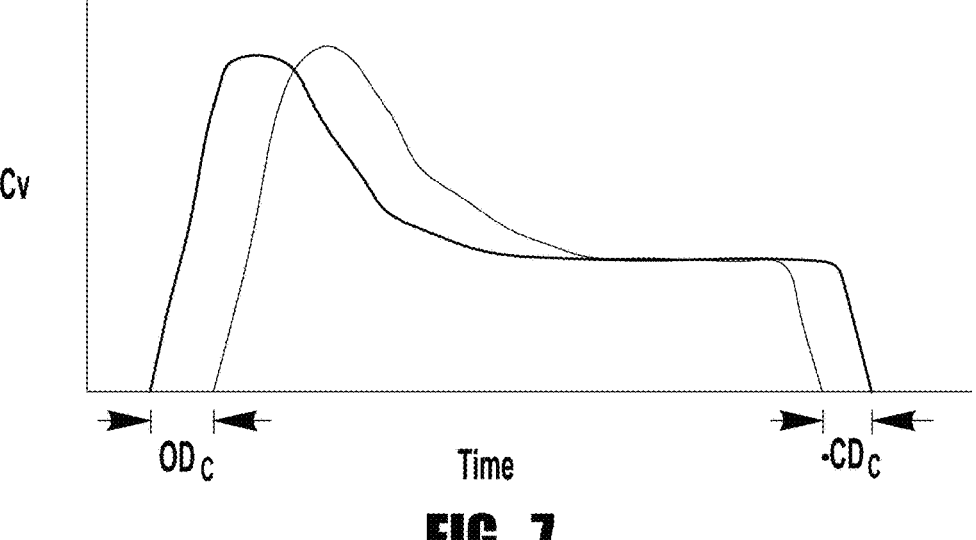
FIG. 7
FIG. 8

SYSTEMS AND METHODS FOR SYNCHRONIZED VALVE ACTUATION

CROSS-REFERENCE TO RELATED APPLICATION

This application claims priority to and all benefit of U.S. Provisional Patent Application Ser. No. 63/499,500, filed on May 2, 2023, for SYSTEMS AND METHODS FOR SYNCHRONIZED VALVE ACTUATION, the entire disclosure of which is incorporated herein by reference.

BACKGROUND

Actuators are often used to control the operation of valves and other fluid system components. An actuator may be of any number of different designs including pneumatic, hydraulic, electric and so on. Fluid driven actuators use pressurized fluid, such as air, to move one or more fluid driven actuator members (e.g., pistons, diaphragms, bellows, etc.) in order to move a valve element (e.g., a rotary valve stem, plug, diaphragm, and/or bellows) for control (e.g., shutoff, metering, directional control) of system fluid passing through the valve.

A conventional actuated valve assembly uses a spring biased pneumatic actuator for two-position operation of the valve between an actuated position, in response to pressurization of the actuator inlet port to overcome the biasing spring and move the actuator piston and connected valve member, and a normal or return position, in response to venting of the actuator inlet pressure and spring movement of the actuator piston and valve member.

Many different conditions or variables may result in variations in valve cycle flow performance, including, for example, variations in actuator spring stiffness, applied actuator pressure, rate of actuator pressure build-up, and rate of actuator pressure exhaust. Such variations in valve cycle times may cause inconsistent or undesirable fluid flow conditions, which may be compounded when utilizing a multiple valve arrangement to deliver fluid to or from a system.

SUMMARY

In an exemplary embodiment of the present disclosure, a method of controlling fluid flow in a fluid system is contemplated, with the fluid system including an actuated valve assembly including an actuator having an actuator member biased towards a normal position and an inlet port configured to receive a pressurized fluid for movement of the actuator member to an actuated position. In an exemplary method, a command signal pulse is received at a valve controller. In response to receipt of the command signal pulse, after a predetermined opening delay, an actuation signal pulse is transmitted from the valve controller to a pilot valve. In response to receipt of the actuation signal pulse at the pilot valve, the pilot valve is actuated to direct pressurized fluid to the actuator inlet port for movement of the actuator member to the actuated position. In response to movement of the actuator member to the actuated position, a stroke signal pulse is transmitted from a position sensor assembled with the valve assembly to the valve controller. In response to termination of the command signal pulse, after a predetermined closing delay, transmission of the actuation signal pulse to the pilot valve is terminated. In response to termination of the actuation signal pulse, the pilot valve is actuated to divert pressurized fluid from the actuator inlet port for biased movement of the actuator member to the normal position. In response to movement of the actuator member to the normal position, transmission of the stroke signal pulse to the valve controller is terminated. An adjusted predetermined opening delay is calculated based on the time between transmission of the actuation signal pulse and receipt of the stroke signal pulse. An adjusted predetermined closing delay is calculated based on the time between termination of the actuation signal pulse and termination of the stroke signal pulse.

In another exemplary embodiment of the present disclosure, a valve control module includes a controller storing a real time operating system for controlling operation of the valve control module, at least one command signal input connector in circuit communication with the controller and connectable with an external device for receiving command signal pulses from the external device, at least one driver circuit in circuit communication with the controller and connectable with a pilot valve of a valve assembly for transmitting to the pilot valve actuation signal pulses generated by the controller, and at least one digital input connector in circuit communication with the controller and connectable with a position sensor of the valve assembly for receiving stroke signal pulses from the position sensor and communicating the stroke signal pulses to the controller.

In another exemplary embodiment of the present disclosure, a fluid supply system includes at least one actuated valve assembly, a valve control module, and at least one position sensor. The at least one actuated valve assembly includes an actuator having an actuator member biased towards a normal position and a pilot valve connected with an inlet port of the actuator and configured to be operated between a first configuration supplying pressurized fluid to the actuator inlet port for movement of the actuator member to an actuated position and a second configuration diverting pressurized fluid from the actuator inlet port for biased movement of the actuator member to the normal position. The valve control module includes a valve controller configured to receive a command signal pulse and, after a predetermined opening delay, to transmit an actuation signal pulse from the valve controller to the pilot valve for actuation of the pilot valve to the first configuration and corresponding movement of the actuator member to the actuated position. The at least one position sensor is assembled with the at least one valve assembly and is configured to transmit a stroke signal pulse to the valve controller in response to movement of the actuator member to the actuated position. The valve controller is configured to calculate an adjusted predetermined opening delay based on the time between transmission of the actuation signal pulse and receipt of the stroke signal pulse.

In another exemplary embodiment of the present disclosure, a method of synchronizing opening actuation of a first valve assembly with closing actuation of a second valve assembly is contemplated. In an exemplary method, in response to receipt of a first command signal pulse, after a predetermined opening delay, a first actuation signal pulse is transmitted to a first pilot valve to direct pressurized fluid to a first actuator inlet port of a first actuator of the first valve assembly to effect opening actuation of the first valve assembly. In response to termination of a second command signal pulse simultaneous with receipt of the first command signal pulse, transmission of a second actuation signal pulse to a second pilot valve is terminated to divert pressurized fluid from a second actuator inlet port of a second actuator of the second valve assembly to effect spring biased closing actuation of the second valve assembly. The predetermined opening delay includes an offset corresponding to at least one of: (a) a measured delay in a previous opening actuation of the first valve assembly, between transmission of the first actuation signal pulse and opening actuation of the first valve assembly; (b) a non-linear change in flow rate during opening actuation of the first valve assembly; (c) a spike in flow resulting from a choked volume between a valve seat and an upstream orifice restriction of the first valve assembly; and (d) a lag in flow resulting from a choked volume between a valve seat and a downstream orifice restriction of the first valve assembly.

BRIEF DESCRIPTION OF THE DRAWINGS

FIG. 6 is a graphic illustration of flow through synchronized switching valves having an orifice restriction, with an actuation delay applied to the opening valve;

FIG. 7 is a graphic illustration of a flow curve for a valve having a choked volume between an upstream orifice restriction and a valve seat, overlayed with a flow curve for the valve having an opening delay and a closing advance applied to the actuation sequence; and FIG. 8 is a graphic illustration of a flow curve for a valve having a choked volume between a downstream orifice restriction and a valve seat, overlayed with a flow curve for the valve having an opening advance and a closing advance applied to the actuation sequence.

DETAILED DESCRIPTION OF EXEMPLARY EMBODIMENTS

Figure 1:
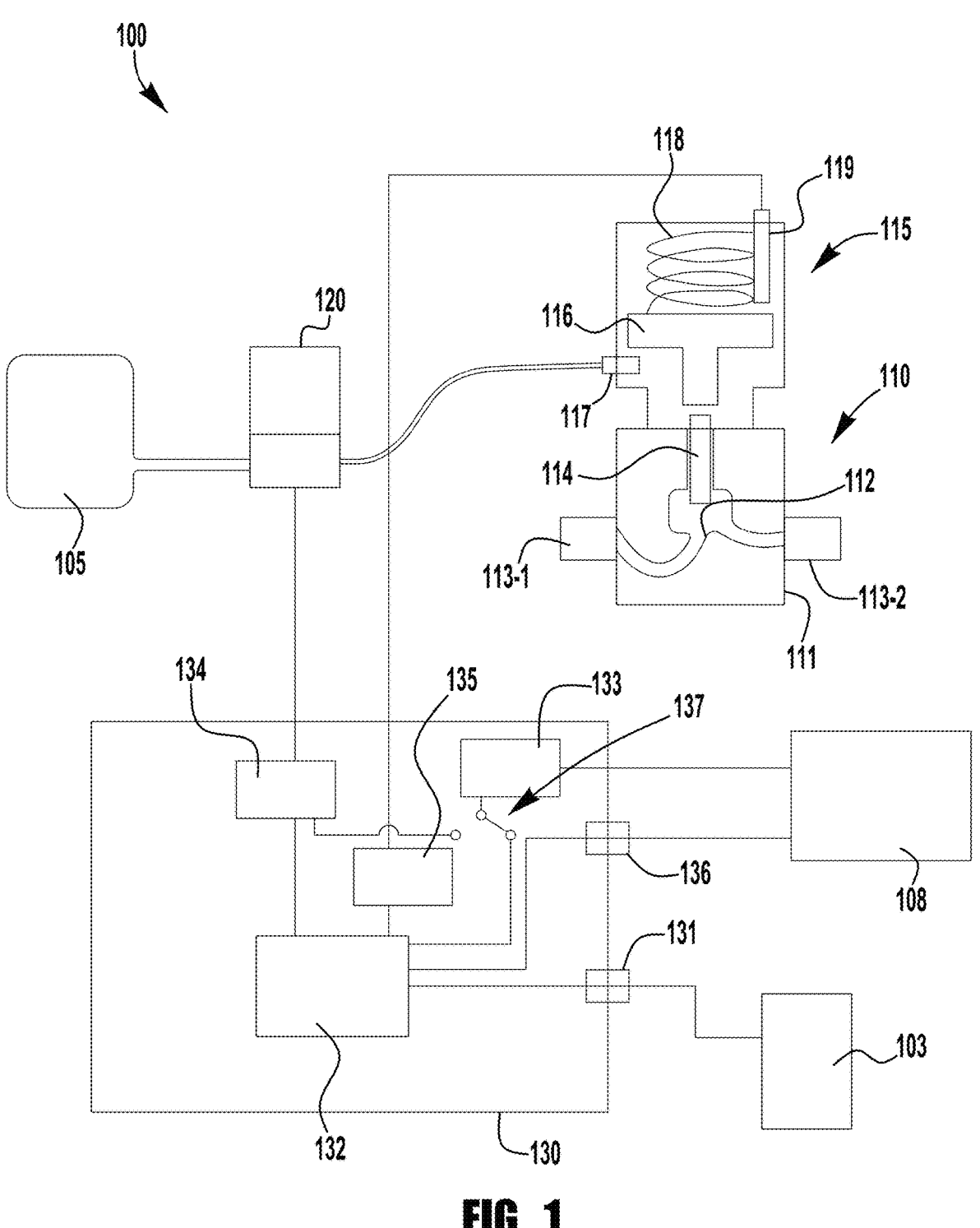
FIG. 1 is a schematic view of a fluid supply system, according to an exemplary embodiment of the present disclosure.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure, however, such values and ranges are not to be construed in a limiting sense and are intended to be critical values or ranges only if so expressly stated. Parameters identified as "approximate" or "about" a specified value are intended to include the specified value, values within 5% of the specified value, and values within 10% of the specified value, unless expressly stated otherwise. Further, it is to be understood that the drawings accompanying the present disclosure may, but need not, be to scale, and therefore may be understood as teaching various ratios and proportions evident in the drawings. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated.

In systems utilizing frequently cycled valves to provide controlled doses of a fluid (e.g., chemical doses in an atomic layer deposition or ALD process), deviations or inconsistencies in the opening and/or closing actuation timing of the valve may produce undesirable deviations or inconsistencies in the resulting dose volumes, regardless of the precision with which the valve flow rate is controlled. In some applications, a desired dosage is established based on a known and controlled valve flow rate, from which the required open valve duration is determined.

According to an exemplary aspect of the present disclosure, an actuated valve assembly may be provided with a control system configured to identify deviations in the opening and/or closing actuation timing of the valve and adjusting the initiation of actuator pressurization and depressurization in response to the identified deviations to maintain a desired open valve duration for consistent desired fluid dosage volumes.

In an exemplary system 100, as schematically illustrated in FIG. 1, a valve assembly 110 includes a valve body 111, a valve element 114 (e.g., stem, diaphragm), and an actuator 115. The valve body 111 includes a valve seat 112 disposed between inlet and outlet ports 113-1, 113-2, with the valve element 114 assembled with the valve body and movable with respect to the valve seat between a closed position blocking flow between the inlet port and the outlet port and an open position permitting flow between the inlet port and the outlet port. The actuator 115 is assembled with the valve body 111 and includes a fluid driven actuator member 116 (e.g., piston) operatively connected with the valve element 114 for movement of the valve element from a first (e.g., closed) position to a second (e.g., open) position in response to the supply of a pressurized actuation fluid to an inlet port 117 of the actuator.

To control actuation of the valve 110, the actuator inlet port 117 is connected with a pressurized actuation fluid source 105 by a pilot valve 120 (e.g., solenoid) configured to supply pressurized actuation fluid (e.g., air) from the pressurized actuation fluid source to the actuator inlet port in an energized (e.g., opening) configuration to move the actuator member 116 against a biasing element 118 (e.g., spring) of the actuator 115 for movement of the valve element 114 from the first position to the second position, and to divert or vent pressurized actuation fluid from the actuator inlet port in a de-energized (e.g., closing) configuration to allow biasing member driven movement of the actuator member for movement of the valve element from the second position to the first position. In the illustrated system 100, actuation of the pilot valve 120 is initiated by a control module 130 (e.g., circuit board based device) configured to send actuation signal pulses to the pilot valve to operate the pilot valve between the energized and de-energized configurations. The control module 130 may be programmed or directed (e.g., with a "recipe") to control the timing of the opening and closing of the valve assembly 110 to provide a desired open valve duration corresponding to a desired fluid dose, based on a predetermined flow rate through the open valve assembly.

To monitor and control the actual timing and duration of the open valve condition, the actuator 115 may be provided with a position sensor 119 configured to generate a stroke signal pulse when the actuator member 116 reaches a position in the actuation stroke (e.g., a mid-stroke position, such as a midpoint in the actuator stroke, or a position corresponding to a midpoint of the flow curve) identifying actuation of the actuator member and valve element 114. Many different types of position sensor arrangements may be utilized, including, for example, a proximity sensor installed in the actuator piston chamber (e.g., through an actuator cap) and configured to detect the actuator piston when the actuator piston reaches a predetermined stroke position during actuation. The position sensor 119 is in electronic communication with the control module 130 (e.g., wired or wireless communication) to deliver the stroke signal pulse to the control module, to provide confirmation of actuation and to indicate to the control module the timing of the actuation.

In the event of deviations in the opening and/or closing actuation timing of the valve assembly 110, as identified by the stroke signal pulses delivered to the control module 130, the system 100 may be configured to adjust the timing of the actuation signal pulses to the pilot valve 120 to correct for these deviations, for example, to maintain a consistent desired dosage timing and volume. In some such systems, the control module may receive command signal pulses from a program or recipe providing device 108 (e.g., external computer), with the local control module 130 delaying transmission of an actuation signal pulse to the pilot valve 120 by a predetermined opening delay time OD based on measured delays between the transmitted actuation signal pulse and the received stroke signal pulse in one or more prior cycles. By configuring the local control module 130 for applying these actuation adjustments, adaptations to the actuation signal pulse timing are controlled locally at the control module while allowing the computer provided program or recipe to remain unchanged. In other arrangements, the program or recipe defining dosing frequency, volume, and timing may be stored on the control module, thereby eliminating communication with an external device.

The valve control module 130 is configured to control actuation of one or more valve assemblies based on a program or recipe provided by a connected (e.g., wired or wireless) computer or other device. In the illustrated embodiment, the valve control module 130 includes a main power port 131 for receiving power from a connected power source 103 (e.g., battery, power outlet) and a controller (e.g., microprocessor or MPU) 132 storing a real time operating system for controlling operation of the valve control module 130. The controller 132 is in circuit communication with a command signal input connector 133 connectable (e.g., wired or wireless) with the external computer 108 for receiving command signal pulses, and with a driver circuit 134 connectable (e.g., wired or wireless) with the pilot valve 120 of the valve assembly 110 for transmitting to the pilot valve actuation signal pulses received from the controller 132. The controller 132 is in circuit communication with a digital input connectors 135 connectable (e.g., wired or wireless) with the position sensor 119 of the valve assembly 110 for receiving stroke signal pulses from the position sensor and communicating the stroke signal pulses to the controller. As shown, the valve control module 130 may include a communication port 136, such as, for example, any suitable wired communication port (e.g., universal synchronous/asynchronous receiver/transmitter or USART, Ethernet, EtherCAT®, or Modbus®) or any suitable wireless communication port (e.g., Bluetooth®, Wi-Fi, cellular communication, or RFID), in circuit communication with the controller 132 for transmitting valve cycle data from the controller to the external computer 108 or other external device, for example, to monitor valve performance.

Figure 2:
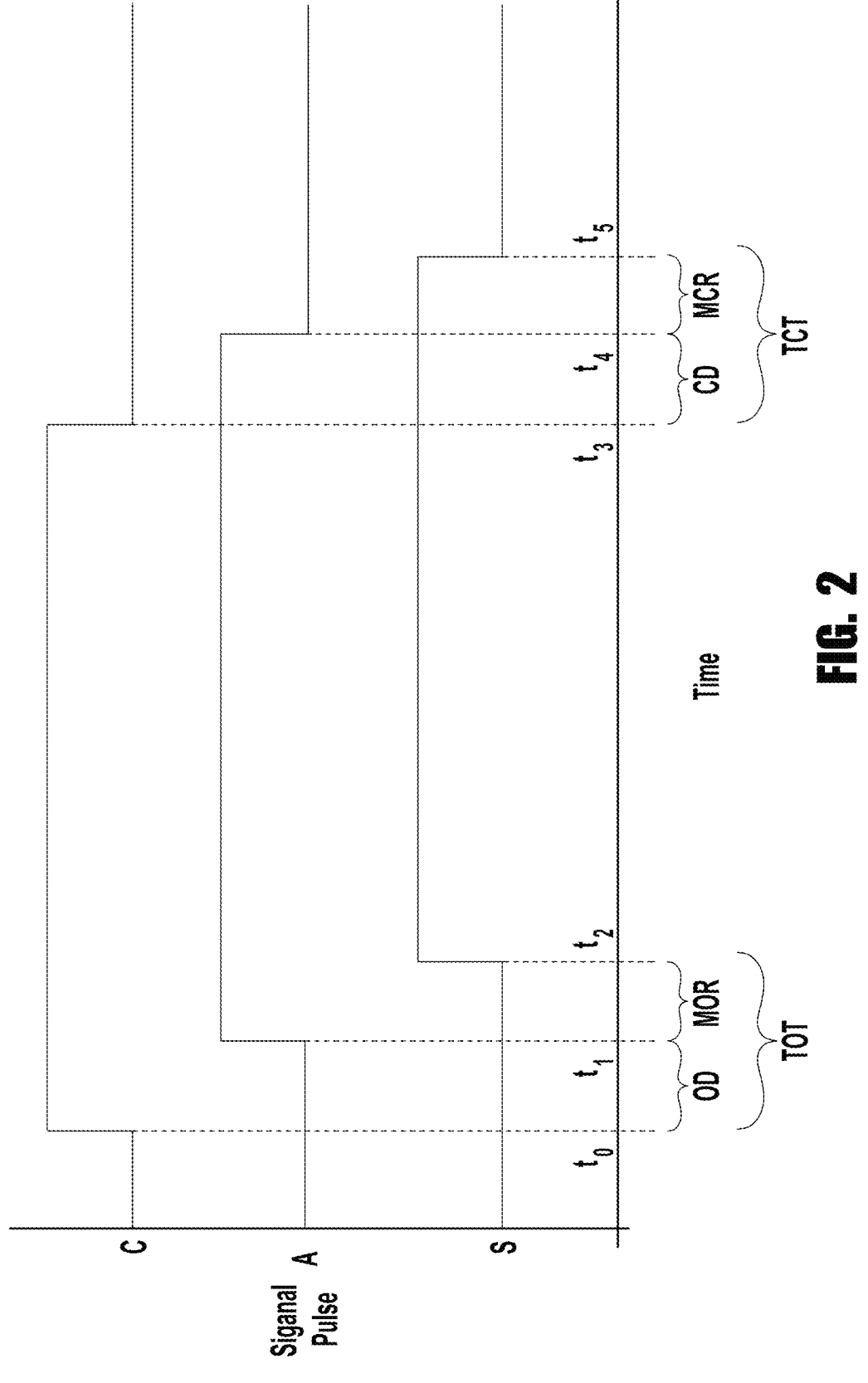
FIG. 2 is a graphic illustration of a signal pulse arrangement for controlling timing of actuation of an actuated valve assembly, according to an exemplary embodiment of the present disclosure.

According to an exemplary aspect of the present disclosure, in an exemplary method for controlling fluid dosage supplied by one or more actuated valve assemblies, a computer 108 transmits a command signal pulse C (at time $t_0$, FIG. 2) to a valve control module 130 (e.g., to the command signal input connector 133) in accordance with a fluid dosing recipe. Upon receipt of the command signal pulse C (e.g., communicated to the controller 132 from the signal input connector 133), the controller initiates a delay timer configured to delay transmission of an actuation signal pulse A (at time $t_1$) from the controller 132 to the pilot valve 120 (e.g., via the driver circuit 134) by a predetermined opening delay time OD. Upon receipt of the actuation signal pulse A, the pilot valve 120 is operated to supply pressurized actuation fluid from a fluid pressure source 105 to the actuator inlet port 117 of the actuated valve assembly 110. When the fluid supplied to the actuator inlet port 117 reaches a pressure sufficient to overcome the biasing force of the actuator biasing member 118 and any other forces resisting valve actuation (e.g., piston and/or valve element friction forces), the actuator member 116 moves toward the opening position, activating the position sensor 119 when the actuator member reaches a predetermined stroke position. The position sensor 119 transmits a corresponding stroke signal pulse S (at time $t_2$) to the valve control module 130 (e.g., to the controller 132 via the digital input connector 135), and the controller 132 calculates any delay between the transmission of the actuation signal pulse A to the pilot valve 120 and the receipt of the stroke signal pulse S from the position sensor 119.

Based on the fluid dosing recipe, the computer 108 terminates transmission of the command signal pulse C to the valve control module 130 after a programmed duration (at time $t_3$), as determined by the desired dose volume and expected flow rate through the open valve assembly 110. Upon termination of the command signal pulse C, the controller 132 initiates a delay timer configured to delay termination of the actuation signal pulse A (at time $t_4$) from the valve control module 130 to the pilot valve 120 by a predetermined closing delay time CD. Upon termination of the actuation signal pulse A, the pilot valve 120 is operated (e.g., de-energized) to divert pressurized actuation fluid from the actuator inlet port 117 of the actuated valve assembly 110. When the pressure applied to the actuator inlet port 117 is sufficiently reduced to be overcome by the biasing force of the actuator biasing member 118, the actuator member 116 moves toward the closing position, deactivating the position sensor 119 when the actuator member moves beyond the predetermined stroke position, thereby terminating transmission of the stroke signal pulse (at time $t_5$) to the controller 132 (via the digital input connector 135), and the controller calculates any delay between the termination of the actuation signal pulse to the pilot valve 120 and the termination of the stroke signal pulse received from the position sensor 119.

To maintain consistent opening valve stroke timing over repeated cycling of the valve assembly 110 in the presence of deviations in conditions affecting delays in valve actuation (e.g., actuation fluid pressure, valve and actuator friction forces, etc.), the controller 132 may be configured to provide for a target open time TOT between receipt of the command signal pulse from the computer 108 and receipt of the stroke signal pulse from the actuator position sensor 119. This constant value target open time TOT may be selected to be greater than any expected actuation delays, as measured by the position sensor 119, such that the opening delay OD may be varied to provide a substantially constant target open time TOT when combined with the measured actuation delay or measured opening response MOR (i.e., time between generation of the actuation signal pulse and receipt of the stroke signal pulse).

In some such systems, the calculation of the opening delay OD for a valve cycle n may be based on the measured opening response MOR of the immediately preceding valve cycle (n-1), such that, for example, $OD_n=TOT-MOR_{n-1}$, utilizing the assumption that valve stroke delays for consecutive valve cycles will be relatively consistent, with negligible variations. In other systems, the iteratively determined opening delay OD may be modified using one or more algorithms or other such numerical schemes to optimize flow accuracy, flow consistency, and/or valve/actuator performance. As one example, the opening delay OD may be dampened, for example, by an opening delay calculation that incorporates a damping factor DFO. As one example, the opening delay OD for a valve cycle n may be calculated as $OD_n=TOT-(1-DFO)*OD_{n-1}-DFO*MOR_{n-1}$, with the damping factor DFO being set to a value between 0 and 1 to provide a desired degree of dampening. In still other arrangements, the opening delay OD may be based, at least in part, on the average measured opening response MOR of a defined number (x) of preceding valve cycles, such that, for example, $OD_n=TOT-(MOR_{n-x}+ \ldots +MOR_{n-1})/x$. Still other algorithms or numerical schemes may be utilized to appropriately adjust the opening delay OD.

To maintain consistent closing valve stroke timing over repeated cycling of the valve assembly 110 in the presence of deviations in conditions affecting delays in valve actuation (e.g., actuation fluid pressure, valve and actuator friction forces, etc.), the controller 132 may be configured to provide for a target close time TCT between termination of the command signal pulse from the computer 108 and termination of the stroke signal pulse from the actuator position sensor 119. This constant value target close time TCT may be selected to be greater than any expected actuation delays, as measured by the position sensor 119, such that the closing delay CD may be varied to provide a substantially constant target close time TCT when combined with the measured actuation delay or measured closing response MCR (i.e., time between termination of the actuation signal pulse and termination of the stroke signal pulse).

In some such systems, the calculation of the closing delay CD for a valve cycle n may be based on the measured closing response MCR of the immediately preceding valve cycle (n-1), such that, for example, $CD_n=TCT-MCR_{n-1}$, utilizing the assumption that valve stroke delays for consecutive valve cycles will be relatively consistent, with negligible variations. In other systems, the iteratively determined closing delay CD may be modified using one or more algorithms or other such numerical schemes to optimize flow accuracy, flow consistency, and/or valve/actuator performance. As one example, the closing delay CD may be dampened, for example, by a closing delay calculation that incorporates a damping factor DFC. As one example, the closing delay CD for a valve cycle n may be calculated as $CD_n=TCT-(1-DFC)*CD_{n-1}-DFC*MCR_{n-1}$, with the damping factor DFC being set to a value between 0 and 1 to provide a desired degree of dampening. In still other arrangements, the closing delay CD may be based, at least in part, on the average measured closing response MCR of a defined number (x) of preceding valve cycles, such that, for example, $CD_n=TCT-(MCR_{n-x}+ \ldots +MCR_{n-1})/x$. Still other algorithms or numerical schemes may be utilized to appropriately adjust the closing delay CD.

Figure 2A:
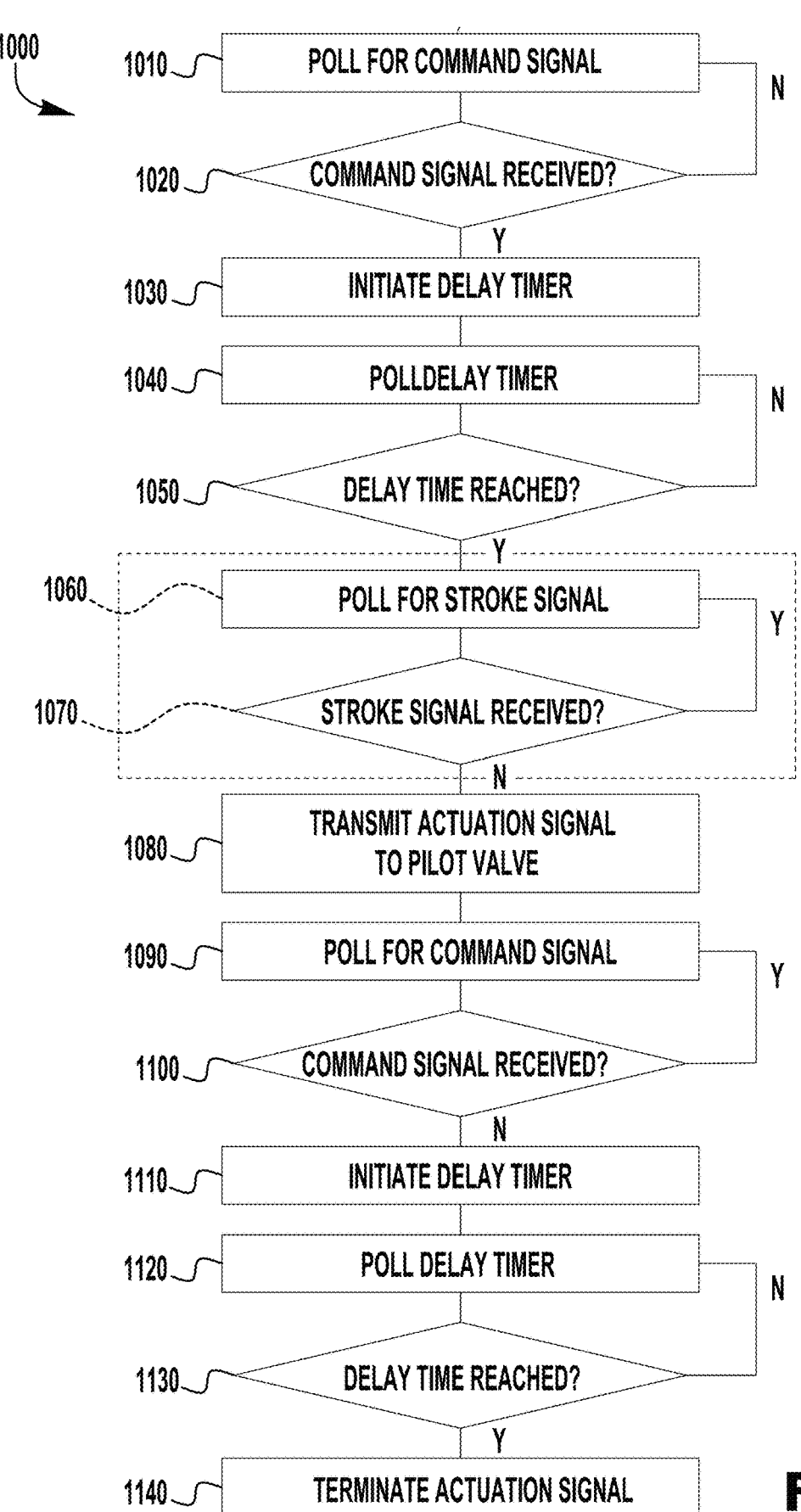
FIG. 2A is a flow chart illustrating a process for controlling fluid flow in a fluid system, according to an exemplary embodiment of the present disclosure.

In an exemplary process 1000 of controlling fluid flow in a fluid system using a valve control module (e.g., any of the valve control modules described herein), as illustrated in the flow chart of FIG. 2A, the controller of the valve control module polls for a command signal from an external device (e.g., from a command signal input connector), at 1010. If/when a command signal is received (at 1020), the controller initiates a delay timer to increment an opening delay OD (at 1030). The delay timer is polled by the controller (at 1040), and when the predetermined opening delay OD time is reached (at 1050), an actuation signal is transmitted from the controller to the pilot valve (e.g., via a driver circuit), at 1080, thereby actuating the pilot valve for pneumatic actuation of the valve assembly to an actuated (e.g., open) position. The controller continues to poll for the command signal (at 1090), and when the command signal is no longer being received (at 1100), the controller initiates a delay timer to increment a closing delay CD (at 1110). The delay timer is polled by the controller (at 1120), and when the predetermined closing delay CD is reached (at 1130), the actuation signal is terminated (at 1140), causing the pilot valve to close, for return of the valve assembly to the normal (e.g., closed) position.

In applications requiring continuous controller monitoring and precise adjustment of actuation signal transmissions, controller hardware based failures or errors may develop in a valve control module, causing missed or delayed signal pulses and an unacceptable (e.g., in volume/duration and/or timing) fluid supply. In some implementations, the valve control module controller may be configured to initiate a passthrough mode in response to receipt or identification of an error signal corresponding to, for example, failure to receive or recognize a pulse transmission or receipt of a significantly delayed pulse transmission. As shown in the illustrated embodiment of FIG. 1, the valve control module 130 may be provided with a relay switch 137 that may be connected between the command signal input connector 133 and the driver circuit 134 and operated (e.g., activated or deactivated) by the controller 132 in response to controller receipt of the error signal, such that subsequent command signal pulses generated by the external computer 108 and transmitted through the command signal input connector 133 bypass the controller for transmission directly to the driver circuit 134 for transmission of the command signal pulses to the pilot valve 120. The resulting actuations of the valve assembly would continue in accordance with the supplied program or recipe, without the (potentially faulty) adjustment by the valve control module. In response to receipt of the error signal, the controller 132 may additionally be configured to transmit a notification signal to the external computer 108 via the communication port 136 to identify the detected error and resulting entry into the passthrough mode. Reversion of the valve control module 130 from the passthrough mode to the standard operating mode may be configured to require manual user operation of the relay switch(es) 137, and/or a communication signal from the external computer 108 through the communication port 136, directing a reset of the valve control module.

Figure 3:
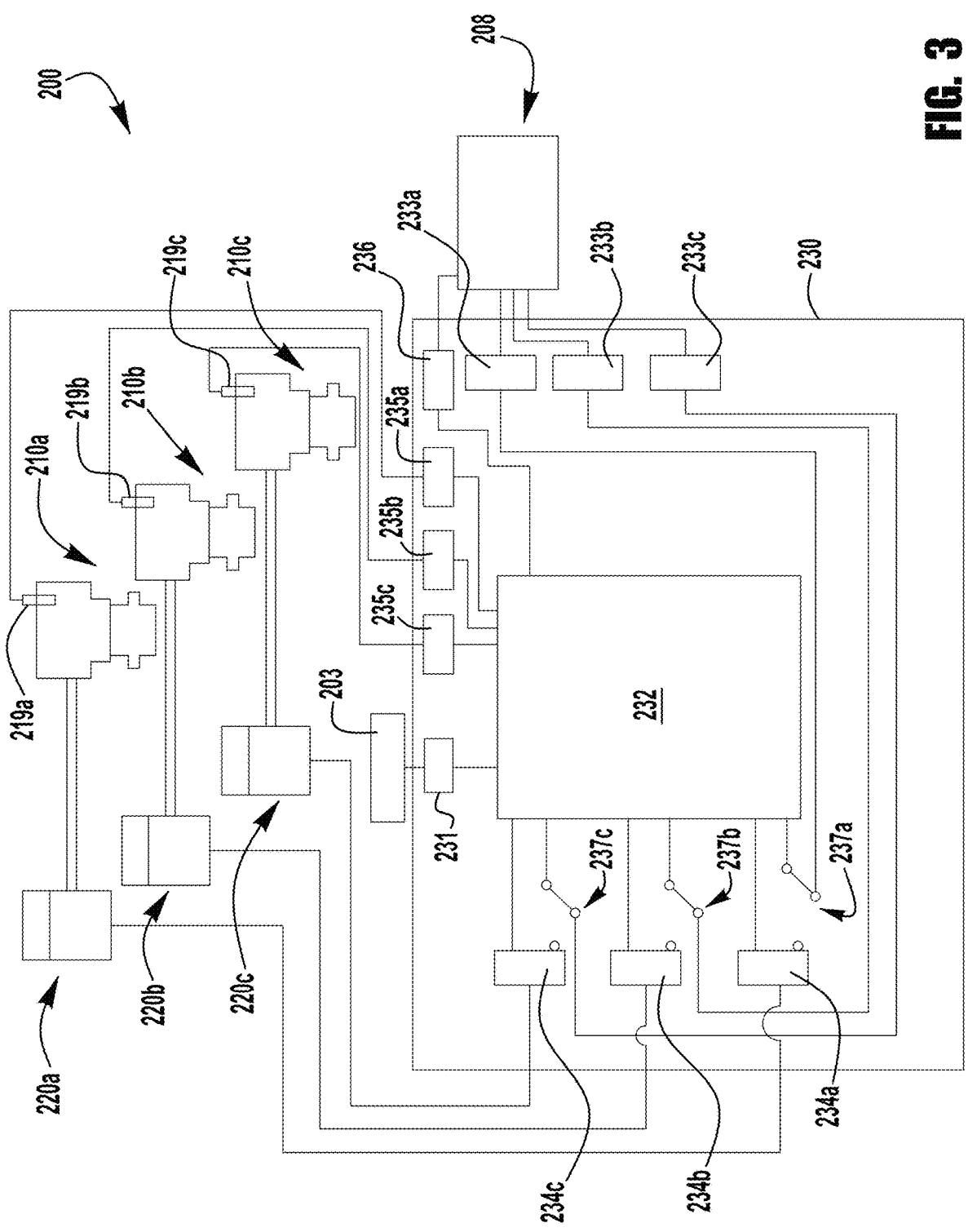
FIG. 3 is a schematic view of a fluid supply system, according to an exemplary embodiment of the present disclosure.

In some embodiments, the valve control device may be configured to independently control actuation of a plurality of valve assemblies. FIG. 3 illustrates an exemplary system 200 including a plurality of valve assemblies 210a-c (e.g., three, as shown, or more or fewer than three), which may (but need not) be similar to the valve assembly 110 of FIG. 1, for which actuation of a corresponding pilot valve 220a-c is initiated by a control module 230 (e.g., circuit board based device) configured to send actuation signal pulses to the corresponding pilot valve to operate the pilot valve between the energized (e.g., open) and de-energized (e.g., closed) configurations. The control module 230 may be programmed or directed (e.g., with a "recipe") to control the timing of the opening and closing of each of the valve assemblies 210a-c to provide desired open valve timing and durations duration corresponding to desired fluid doses, based on predetermined flow rates through the open valve assemblies.

In the event of deviations in the opening and/or closing actuation timing of selected valve assemblies 210a-c, as identified by the stroke signal pulses delivered to the control module 230, the system 200 may be configured to adjust the timing of the actuation signal pulses to the pilot valves 220a-c to correct for these deviations, for example, to maintain a consistent desired dosage timing and volume. In some such systems, the control module may receive command signal pulses from a program or recipe providing device 208 (e.g., external computer), with the local control module 230 delaying transmission of an actuation signal pulse to the selected pilot valve(s) 220a-c by a predetermined opening delay time OD based on measured delays between the transmitted actuation signal pulse and the received stroke signal pulse in one or more prior cycles. By configuring the local control module 230 for applying these actuation adjustments, adaptations to the actuation signal pulse timing are controlled locally at the control module while allowing the computer provided program or recipe to remain unchanged. In other arrangements, the program or recipe defining dosing frequency, volume, and timing may be stored on the control module, thereby eliminating communication with an external device.

The valve control module 230 is configured to control actuation the valve assemblies 210a-c based on a program or recipe provided by a connected (e.g., wired or wireless)

computer or other device. In the illustrated embodiment, the valve control module 230 includes a main power port 231 for receiving power from a connected power source 203 (e.g., battery, power outlet) and a controller (e.g., microprocessor or MPU) 232 storing a real time operating system for controlling operation of the valve control module 230. The controller 232 is in circuit communication with a plurality of command signal input connectors 233a-c connectable (e.g., wired or wireless) with the external computer 208 for receiving command signal pulses, and with a plurality of corresponding driver circuits 234a-c connectable (e.g., wired or wireless) with the corresponding pilot valves 220a-c of the valve assemblies 210a-c for transmitting to the pilot valve actuation signal pulses received from the controller 232. The controller 232 is in circuit communication with a plurality of digital input connectors 235a-c connectable (e.g., wired or wireless) with position sensors 219a-c of the corresponding valve assemblies 210a-c for receiving stroke signal pulses from the position sensors and communicating the stroke signal pulses to the controller. As shown, the valve control module 230 may include a communication port 236, such as, for example, any suitable wired communication port (e.g., universal synchronous/asynchronous receiver/transmitter or USART, Ethernet, EtherCAT®, or Modbus®) or any suitable wireless communication port (e.g., Bluetooth®, Wi-Fi, cellular communication, or RFID), in circuit communication with the controller 232 for transmitting valve cycle data from the controller to the external computer 208 or other external device, for example, to monitor valve performance.

The valve control module 230 may be provided with a plurality of relay switches 237a-c that may be connected between corresponding ones of the command signal input connectors 233a-c and the driver circuits 234a-c and operated (e.g., activated or deactivated) by the controller 232 in response to controller receipt of an error signal (as described above), such that subsequent command signal pulses generated by the external computer 208 and transmitted through the command signal input connectors 233a-c bypass the controller for transmission directly to the driver circuit 234a-c for transmission of the command signal pulses to the pilot valves 220a-c. The resulting actuations of the valve assembly would continue in accordance with the supplied program or recipe, without the (potentially faulty) adjustment by the valve control module. In response to receipt of the error signal, the controller 232 may additionally be configured to transmit a notification signal to the external computer 208 via the communication port 236 to identify the detected error and resulting entry into the passthrough mode. Reversion of the valve control module 230 from the passthrough mode to the standard operating mode may be configured to require manual user operation of the relay switches 237a-c, and/or a communication signal from the external computer 208 through the communication port 236, directing a reset of the valve control module by operation (e.g., activation or deactivation) of the relay switches.

Figure 3A:
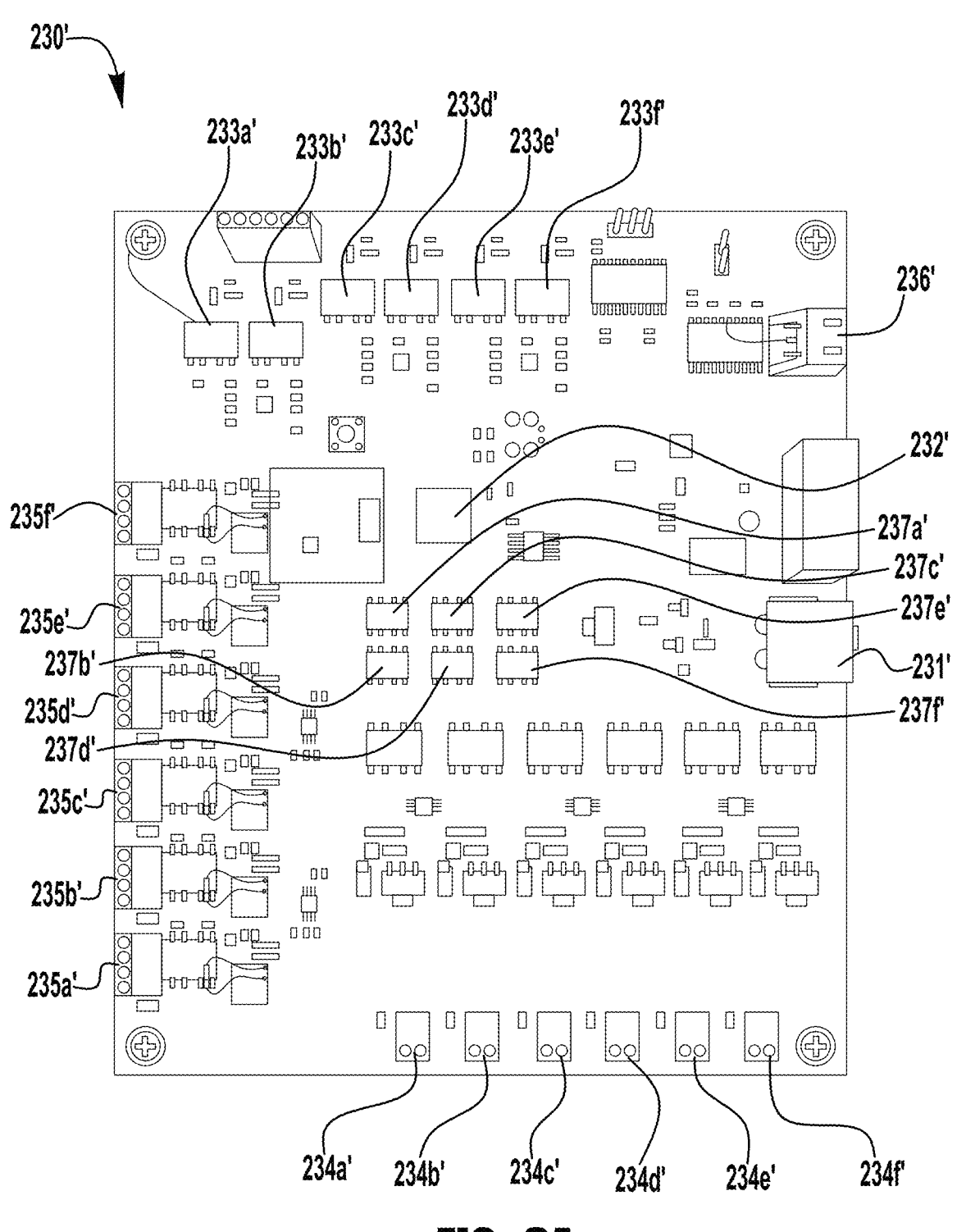
FIG. 3A is a top view of an electronic valve control module, according to an exemplary embodiment of the present disclosure.

FIG. 3A illustrates an exemplary embodiment of a circuit board (PCB) based valve control module 230' having a controller 232' in circuit communication with six command signal input connectors 233a'-f, six driver circuits 234a'-f, six controller bypassing relay switches 237a'-f, and six digital input connectors 235a'-f for independently controlled actuation of up to six valve assemblies, along with a main power port 231' and communication port 236', as described above. In other embodiments, a valve control device may be configured to independently control any suitable number of valve assemblies (i.e., fewer or more than six valve assemblies). In some such arrangements, the controller 232' may be configured to simultaneously monitor the positions of each of the plurality of valve assemblies, in real time during operation of the system. This monitoring may be used to identify actuation inconsistencies between valve assemblies and/or actuation inconsistencies over time, to provide an alert to a system operator (e.g., through communication with an external computer or other such device) and/or to initiate and/or modify actuation adjustments by the controller to one or more of the valve assemblies, for example, to maintain consistent, synchronized, and/or properly ordered actuation of the multiple valve assemblies.

Figure 4:
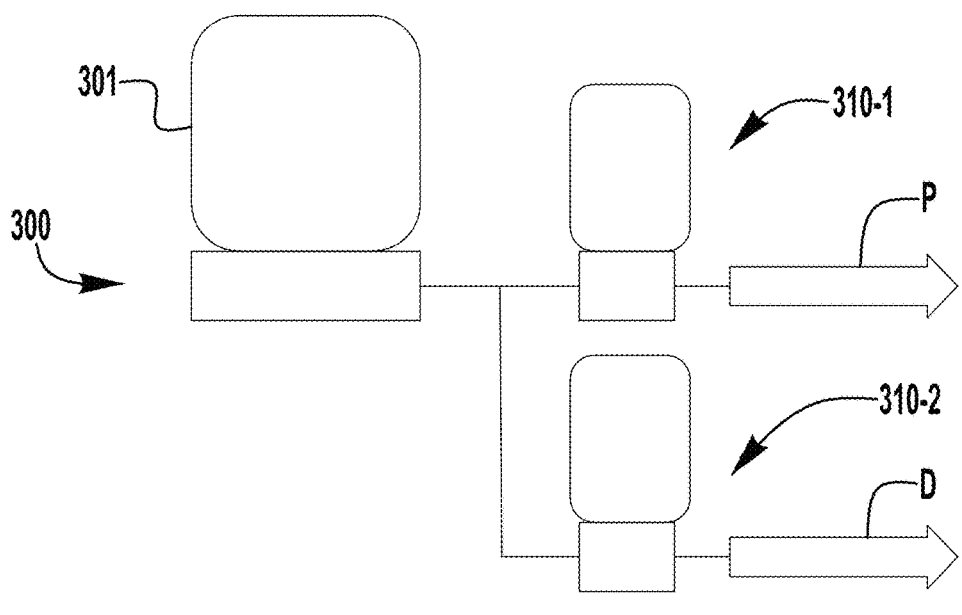
FIG. 4 is a schematic illustration of a multiple valve switching system, according to an exemplary embodiment of the present disclosure.

In some implementations, a multiple valve fluid system may be configured to deliver fluid from a single source to multiple locations or outlets. As one example, as schematically shown in FIG. 4, a multiple valve switching system 300 may utilize two or more valves 310-1, 310-2 downstream from a mass flow controller 301 (MFC) or other substantially constant flow source. In many such applications, to maintain substantially constant flow from the flow source (e.g., to avoid rapid pulsing or downstream flow fluctuations for which the MFC is unable to adequately compensate), it may be desirable to synchronize actuation of the switching valves 310-1, 310-2 such that total flow through the valves remains substantially constant as at least one valve is actuated to a closed position and at least one valve is actuated to an open position. In an exemplary application, a divert system for an atomic layer deposition (ALD) system includes a first actuated valve 310-1 that delivers pulsed fluid flow from the MFC to an ALD process line P, and a second actuated valve 310-2 that delivers pulsed fluid flow from the MFC to a waste or drain line D when the first actuated valve is closed, such that the pulsing of the fluid flow to the process line is not experienced by the MFC, which is allowed to maintain a substantially constant fluid flow rate.

Many factors affect variations in total flow through synchronized switching valves during actuation. For example, different pneumatically actuated valves may have different actuator pressure required for actuation, different flow rates through the actuator supply or exhaust lines, different valve stroke distances/times, and different actuator stroke times on a return stroke (controlled by spring force and rate of venting actuation fluid) compared to a forward or positive stroke (controlled by actuating fluid pressure overcoming spring forces). These variations can result in deviations in the actuation timing of the valves, such that simultaneous opening and closing actuation signals operating pilot valves to supply actuation fluid through a first (e.g. supply) valve and a second (e.g., vent) valve can result in mis-matched valve strokes of the two valves and varying total fluid flow through the valves (and from the MFC) during these cycle times.

To address these varying valve stroke response times, a valve control device configured to adjust valve actuation based on calculated actuation signal pulse transmission delays, as described above, may be configured to apply additional opening delay $OD_A$ and/or closing delay $CD_A$ adjustments, similar to those described above, to adjust the second (vent) valve actuation timing relative to the first (supply) valve actuation timing to maintain more consistent fluid flow demand from the fluid supplying MFC.

Figure 5A:
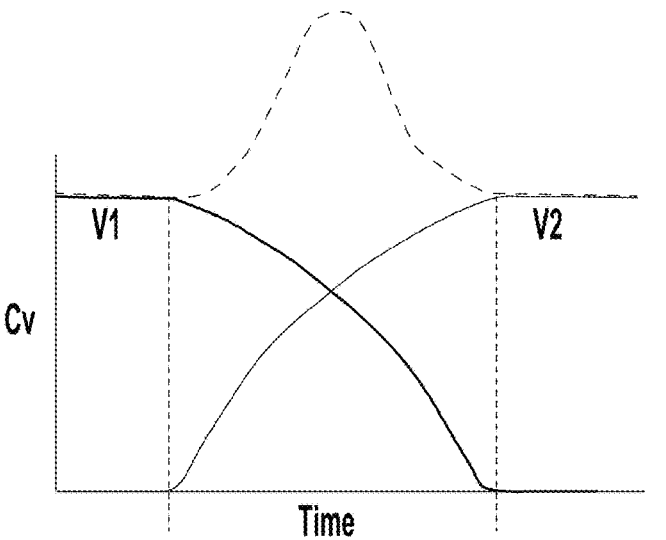
FIG. 5A is a graphic illustration of total fluid flow through synchronized switching valves.
Figure 5B:
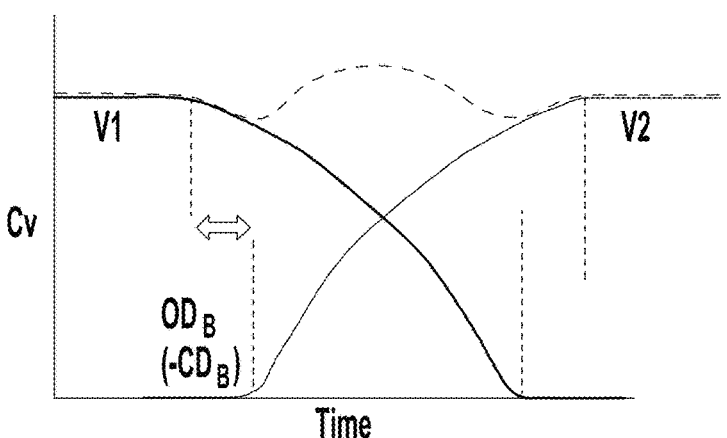
FIG. 5B is a graphic illustration of total fluid flow through synchronized switching valves, with an actuation delay applied to the opening valve.

Another factor affecting variations in total flow through an array of switching valves during actuation is the non-linearity of fluid flow rate change through the valve during actuation, as shown in FIGS. 5A and 5B, such that the midpoint of the actuator stroke does not correspond to a midpoint in the valve flow rate $(C_V)$. In an exemplary actuated valve embodiment, the midpoint in the valve flow rate, where the flow coefficient $C_V$ is half the maximum flow coefficient $C_{Vmax}$, occurs at an actuator stroke position significantly closer to the closed position (e.g., about 15%-30% of the full actuator stroke from the closed position). If the closing valve and opening valve are actuated simultaneously (FIG. 5A), and exhibit similar, but inverted, flow vs. stroke curves, the opening valve reaches midpoint flow before the closing valve reaches midpoint flow, resulting in an extended period during actuation in which a greater total fluid flow passes through the valves.

To address the total flow variation caused by non-linear fluid flow rate change during actuation, the actuation system may be configured to delay actuation of the opening valve relative to actuation of the closing valve, or to advance actuation of the closing valve relative to actuation of the opening valve (FIG. 5B), to minimize the total flow deviation during actuation, as compared to total flow in the fully actuated condition (e.g., with one valve fully open and the other valve fully closed). In some arrangements the opening valve delay $OD_B$ or the closing valve advance $-CD_B$ may be set to approximate the time difference between the Cv midpoint and the stroke duration midpoint. For example, in an exemplary arrangement using valves having an actuation stroke duration of about 2.5 ms (i.e., stroke duration midpoint of about 1.25 ms) and a midpoint flow condition during opening or Cv midpoint at about 0.75 ms, the controller may be configured to delay actuation of the opening valve, or to advance actuation of the closing valve, by about 0.5 ms (i.e., the time difference between the 1.25 ms stroke duration midpoint and the 0.75 ms opening flow midpoint). Alternatively, the opening actuation delay $OD_B$ or closing actuation advance $-CD_B$ may be set at a fraction of the valve stroke duration, such as, for example, 15%-30%, or about 20%, of the valve stroke duration (e.g., 0.50 ms delay for a valve having an opening stroke duration of 2.5 ms).

In some implementations, such as the ALD supply and vent valve application described above, delay of the opening actuation timing and/or advance of the closing actuation timing of the supply valve 310-1 may result is a supplied dose that deviates from (e.g., is smaller than) the desired dose. In some such arrangements, adjustments may be limited to the vent valve 310-2, for which dose volumes are not critical. For example, in such an arrangement, the vent valve 310-2 may have a non-linear flow based opening delay $OD_B$ and closing advance $-CD_B$, with no non-linear flow curve adjustment for the supply valve 310-1.

In some valve arrangements, one or more of the valves may include an orifice restriction (e.g., assembled with or integrated into the valve) selected to limit valve flow to a desired reduced flow rate. In such an arrangement, the midpoint flow position of the actuator/actuating element deviates more significantly from the midpoint position and midpoint duration of the actuator stroke, as the maximum flow coefficient $C_{Vmax}$ is limited by the orifice restriction and the valve reaches the reduced "full flow" condition even closer to the fully closed position. As a result, the opening valve delay $OD_B$ and/or closing valve advance $-CD_B$ corresponding to flow-stroke midpoint deviation of the standard, unrestricted valve, as described above, would likely be insufficient to compensate for the flow change discrepancies between the flow restricted opening and closing valves.

According to an aspect of the present disclosure, to address the total flow variation caused by an orifice restriction associated with the valve(s), the actuation system may be configured to adjust the non-linear flow based opening delay $OD_B$ and closing advance $-CD_B$ (FIG. 6) to further delay actuation of the opening valve or further advance actuation of the closing valve, to minimize the total flow deviation during actuation, as compared to total flow in the fully actuated condition (e.g., with one valve fully open and the other valve fully closed). Unlike the valve stroke flow characteristics of an unrestricted valve, which may be fairly and broadly estimated based on valve type (e.g., using a delay of about 20% of the valve stroke duration), the size of orifice restriction incorporated by the system designer or end user may vary significantly, causing a significant variation in the valve stroke flow midpoint. In an exemplary system, an actuation system may include a controller configured to adjust the non-linear flow based opening delay $OD_B$ and closing advance $-CD_B$ based on a user identified orifice size, for example, one or more orifice size values or ranges of values (e.g., <1 mm, 1 mm to 2 mm, 2 to 3 mm), or one or more orifice restriction flow coefficient $C_{Vor}$ values or ranges of values (e.g., <0.04, 0.04 to 0.18, 0.18 to 0.42), with the smaller orifice restriction corresponding to a proportionally greater actuation delay for the opening valve or actuation advance for the closing valve. In some applications, the flow restriction actuation offsets $OD_B$, $-CD_B$ may correspond to the time difference between the valve stroke midpoint and the restriction Cv midpoint, either replacing the non-restricted opening delay $OD_B$ and closing advance $-CD_B$ or by adding an adjustment factor to the non-restricted opening delay $OD_B$ and closing advance $-CD_B$.

In some embodiments, rather than applying an opening and/or closing actuation offset to account for predetermined or measured timing deviations between the stroke midpoint position and the flow midpoint position of the actuator, an actuator may be provided with an actuator position sensor configured to generate a stroke signal identifying the flow midpoint position, thereby eliminating the need for non-linear flow based actuation offsets $OD_B$, $CD_B$ in adjusting the actuation timing of the valves. In some such arrangements, the actuator position sensor may be adjustable or otherwise configurable to address noted or anticipated changes in the actuation flow curve (e.g., due to use of a different orifice restriction) by adjusting the stroke position at which the sensor generates and/or terminates a stroke signal to correspond with the flow midpoint position of the actuator member. As one example, an optical position sensor may be used to electronically adjust (e.g., change the distance between the sensor and the actuator member at which the sensor is triggered) the actuation set point to correspond to the flow midpoint position of the actuator member.

In some valve arrangements having orifice restrictions, the orifice restriction may be provided in alignment with, or in close proximity to, the valve seat, such that the choked fluid volume in the closed valve is minimized. In valve arrangements having orifice restrictions further upstream from the valve seat, a choked fluid volume between the upstream orifice restriction and the valve seat may produce a spike or burst of fluid flow when the valve is opened. In valve arrangements having orifice restrictions further downstream from the valve seat, a choked fluid volume between the valve seat and the downstream orifice restriction may produce a prolonged flow lag or decay after the valve is closed, and a delayed supply of fluid flow when the valve is opened. While these deviations may not affect the total fluid flow from the flow source, the choked volume induced flow deviations may influence the total dose pulse width and/or resulting dose volume, for example, resulting in a larger than desired fluid dose for valves having an upstream orifice restriction, and a delayed fluid dose for valves having a downstream orifice restriction.

To compensate for the fluid flow burst associated with an upstream orifice restriction, an additional opening actuation signal delay $OD_C$ may be applied to the opening valve, to provide the desired timing of the supplied dose. While this flow burst-based opening delay $OD_C$ may sufficiently adjust the dose volume to a desired volume, in some embodiments, a flow burst-based closing valve advance $-CD_C$ may be applied to more accurately provide the desired dose volume (FIG. 7).

To compensate for the fluid flow decay associated with a downstream orifice restriction, a flow lag-based opening actuation signal advance $-OD_D$ may be applied to the opening valve and a flow lag-based closing actuation signal advance $-CD_D$ may be applied to the closing valve to compensate for delays in flow through the valve and past the downstream orifice restriction while maintaining desired timing and volume of the fluid dose (FIG. 8).

As the choked volume between the valve seat and the orifice restriction may vary based on the type of valve and the type of installed/integrated orifice restriction, in an exemplary system, an actuation system may include a controller configured to apply a flow burst-based actuation signal adjustment $OD_C$, $CD_C$ or a flow lag-based actuation signal adjustment $OD_D$, $CD_D$ based on a user identified valve/orifice restriction type, with the controller including a stored delay/advance setting for the possible valve/orifice restriction type combinations, with the larger choked volume arrangements corresponding to a proportionally greater actuation delay or advance.

In multi-valve switching arrangements having flow conditions affected by one or more of: (a) varying valve stroke response times, (b) total flow variation caused by non-linear fluid flow rate change (or flow rate curve) during actuation, with or without an orifice restriction, and (c) position of the orifice restriction, timing of the opening actuation signal of a first valve may be adjusted by one or more corresponding opening signal timing offsets $OD_A$, $OD_B$, $OD_{C/D}$, and the timing of the closing actuation signal of a second valve may be adjusted by one or more corresponding closing signal timing offsets $CD_A$, $CD_B$, $CD_{C/D}$.

In an exemplary system including a first, unrestricted supply valve $v_1$ and a second, unrestricted vent valve $v_2$ synchronized for directing a substantially continuous fluid flow (e.g., from a mass flow controller), upon receiving a supply valve command signal from the external computer, the valve controller initiates a timer to apply a supply valve opening delay $OD_1$ before transmitting a supply valve actuation signal to the supply valve. The opening delay $OD_1$ corresponds to a valve stroke response based opening delay $OD_{1A}$ calculated (e.g., by the controller) as the recipe defined supply valve total opening time $TOT_1$ minus the supply valve measured opening response $MOR_1$ based adjustment, as described above.

Upon termination of the supply valve command signal from the external computer, the valve controller initiates a timer to apply a supply valve closing delay $CD_1$ before terminating transmission of the supply valve actuation signal to the supply valve $v_1$. The closing delay $CD_1$ corresponds to a valve stroke response based closing delay $CD_{1A}$ calculated (e.g., by the controller) as the recipe defined supply valve total closing time $TCT_1$ minus the supply valve measured closing response $MCR_1$ based adjustment, as described above.

Upon receiving a vent valve command signal from the external computer (e.g., simultaneous with the termination of the supply valve command signal), the valve controller initiates a timer to apply a vent valve opening delay $OD_2$ before transmitting a vent valve actuation signal to the vent valve $v_2$. The opening delay $OD_2$ corresponds to a valve stroke response based opening delay $OD_{2A}$ plus a non-linear flow change based opening delay $OD_{2B}$. The valve stroke response based opening delay $OD_{2A}$ is calculated (e.g., by the controller) as the recipe defined vent valve total opening time $TOT_2$ minus the vent valve measured opening response $MOR_2$ based adjustment, as described above, and the non-linear flow change based opening delay $OD_{2B}$ is provided as a pre-defined (e.g., by the controller, or as an input supplied to the controller) or calculated (e.g., based on measured stroke time) offset time corresponding to the time difference between the stroke midpoint position and the flow midpoint position of the vent valve $v_2$.

Upon termination of the vent valve command signal from the external computer (e.g., simultaneous with the transmission of the supply valve command signal), the valve controller initiates a timer to apply a vent valve closing delay $CD_2$ before terminating transmission of the vent valve actuation signal to the vent valve. The closing delay $CD_2$ corresponds to a valve stroke response based closing delay $CD_{2A}$ minus a non-linear flow change based closing offset or advance $CD_{2B}$. The valve stroke response based closing delay is calculated (e.g., by the controller) as the recipe defined vent valve total closing time $TCT_2$ minus the vent valve measured closing response $MCR_2$ based adjustment, as described above, and the non-linear flow change based closing advance $-CD_{2B}$ is provided as a pre-defined (e.g., by the controller, or as an input supplied to the controller) or calculated (e.g., based on measured stroke time) offset time corresponding to the time difference between the stroke midpoint position and the flow midpoint position of the vent valve $v_2$.

In an exemplary system including a first, orifice restricted supply valve $v_1$ and a second, vent valve $v_2$ synchronized for directing a substantially continuous fluid flow (e.g., from a mass flow controller), upon receiving a supply valve command signal from the external computer, the valve controller initiates a timer to apply a supply valve opening delay $OD_1$ before transmitting a supply valve actuation signal to the supply valve $v_1$. The opening delay $OD_1$ corresponds to a valve stroke response based opening delay $OD_{1A}$ plus a flow burst/lag based offset $OD_{1C/D}$. The valve stroke response based opening delay $OD_{1A}$ is calculated (e.g., by the controller) as the recipe defined supply valve total opening time $TOT_1$ minus the supply valve measured opening response $MOR_1$ based adjustment, as described above. Where the orifice restriction is upstream of the valve seat, the flow burst based opening offset or delay $OD_{1C}$ is provided as a pre-defined (e.g., by the controller, or as an input supplied to the controller) offset time corresponding to the distance (and resulting choked volume) between the orifice restriction and the valve seat. Where the orifice restriction is downstream of the valve seat, the flow lag based opening offset or advance $-OD_{1D}$ is provided as a pre-defined (e.g., by the controller, or as an input supplied to the controller) offset time corresponding to the distance (and resulting choked volume) between the orifice restriction and the valve seat.

Upon termination of the supply valve command signal from the external computer, the valve controller initiates a timer to apply a supply valve closing delay $CD_1$ before terminating transmission of the supply valve actuation signal to the supply valve $v_1$. The closing delay $CD_1$ corresponds to a valve stroke response based closing delay $CD_{1A}$ plus a flow burst/lag based offset $CD_{1C/D}$. The valve stroke response based closing delay $CD_{1A}$ is calculated (e.g., by the controller) as the recipe defined total closing time TCT minus the measured closing response MCR based adjustment, as described above. Where the orifice restriction is upstream of the valve seat, the flow burst based offset or delay $CD_{1D}$ is provided as a pre-defined (e.g., by the controller, or as an input supplied to the controller) offset time corresponding to the distance (and resulting choked volume) between the orifice restriction and the valve seat. Where the orifice restriction is downstream of the valve seat, the flow lag based closing offset or advance $-CD_{1D}$ is provided as a pre-defined (e.g., by the controller, or as an input supplied to the controller) offset time corresponding to the distance (and resulting choked volume) between the orifice restriction and the valve seat.

Upon receiving a vent valve command signal from the external computer (e.g., simultaneous with the termination of the supply valve command signal), the valve controller initiates a timer to apply a vent valve opening delay $OD_2$ before transmitting a vent valve actuation signal to the vent valve $v_2$. The opening delay $OD_2$ corresponds to a valve stroke response based opening delay $OD_{2A}$ plus a non-linear flow change based opening delay $OD_{2B}$. The valve stroke response based opening delay $OD_{2A}$ is calculated (e.g., by the controller) as the recipe defined vent valve total opening time $TOT_2$ minus the vent valve measured opening response $MOR_2$ based adjustment, as described above. The non-linear flow change based opening delay $OD_{2B}$ is provided as a pre-defined (e.g., by the controller, or as an input supplied to the controller) or calculated (e.g., based on measured stroke time) offset time corresponding to the time difference between the stroke midpoint position and the flow midpoint position of the flow restricted vent valve. While a flow burst/lag offset $OD_{2C/D}$ may be applied to the vent valve opening delay $OD_2$, in some arrangements, this adjustment may be disregarded as the volume of the vented "dose" may be considered non-critical.

Upon termination of the vent valve command signal from the external computer (e.g., simultaneous with the transmission of the supply valve command signal), the valve controller initiates a timer to apply a vent valve closing delay $CD_2$ before terminating transmission of the vent valve actuation signal to the vent valve $v_2$. The closing delay $CD_2$ corresponds to a valve stroke response based closing delay $CD_{2A}$ minus a non-linear flow change based closing offset or advance $CD_{2B}$. The valve stroke response based closing delay $CD_{2A}$ may be calculated (e.g., by the controller) as the recipe defined vent valve total closing time $TCT_2$ minus the vent valve measured closing response $MCR_2$ based adjustment, as described above. The non-linear flow change-based closing advance $-CD_{2B}$ is provided as a pre-defined (e.g., by the controller, or as an input supplied to the controller) or calculated (e.g., based on measured stroke time) offset time corresponding to the time difference between the stroke midpoint position and the flow midpoint position of the flow restricted vent valve. While a flow burst/lag offset $CD_{2C/D}$ may be applied to the vent valve closing delay $CD_2$, in some arrangements, this adjustment may be disregarded as the volume of the vented "dose" may be considered non-critical.

Systems for monitoring and controlling pneumatically actuated valve performance may utilize additional or other sensor arrangements to monitor and adjust valve assembly actuation based on other system parameters, including, for example, actuator pressure, system fluid pressure, temperature, and flow rate. As one example, actuator sensor arrangements may be used to detect deviations in actuator pressures during valve cycling, allowing for diagnosis of valve actuation issues (e.g., leakage past the fluid driven actuator member, changes in required actuation force) or for modification of actuator parameters (e.g., to adjust cycle time, pulse duration, closing force, etc.) An exemplary sensor-based system for monitoring and controlling pneumatic actuator performance is described in co-owned U.S. Pat. No. 11,073,442, entitled "SYSTEMS AND METHODS FOR CONTROL AND MONITORING OF ACTUATED VALVES" (the "'442 Patent"), the entire disclosure of which is incorporated herein by reference.

In some implementations, a multiple valve fluid system may be configured to deliver different fluids from multiple sources to a single site or location. As an example, different precursor (high reactive) gases may be sequentially supplied to an atomic layer deposition (ALD) reaction chamber for atomic layer-by-layer growth of films on a target substrate. In some implementations, each of the multiple fluids may be supplied through pairs of switching valve assemblies adjustably controlled and synchronized by a valve control module, for example, to maintain substantially constant flow of the corresponding fluid from the fluid supplying mass flow controller (MFC), as described in greater detail above. In other implementations, each of the multiple fluids may be supplied from a corresponding fluid source through a corresponding single valve assembly adjustably controlled and synchronized by a valve control module, for example, for precise timing and dosing of the supplied fluids.

In some applications, such as, for example, the supply of precursor gases to a reaction chamber for atomic layer deposition, this simultaneous open condition of more than one of the valve assemblies may result in undesirable or unacceptable mixing of the fluids. In such applications, an externally provided program or recipe for sequentially supplying different fluids to a target location may be configured such that all other valve assemblies be closed before a selected valve assembly is opened. Despite these recipe or program configurations, in implementations in which the valve control module provides for actuation signal timing and/or duration adjustments, such adjustments to the valve controlling actuation signals may result in adjusted control of the valve assemblies that could cause more than one valve to be open at the same time. Additionally or alternatively, other system conditions may result in delayed opening and closing of one of the valve assemblies, such as, for example, reduced pneumatic pressure to the actuator delaying valve opening, or restricted or choked pneumatic pressure exhaust from the actuator delaying valve closing.

According to an exemplary aspect of the present disclosure, a valve control module (e.g., an actuation signal adjusting valve control module, as described above) in controlling communication with a plurality of fluid supplying valve assemblies may include a controller configured to audit or otherwise identify the condition (open or closed) of each of the valve assemblies before transmitting an actuation signal pulse to a selected one of the valve assemblies. If the controller receives an indication that one of the other (non-selected) valve assemblies is in an open condition (e.g., a stroke signal pulse transmitted to the controller), the controller will delay or cancel transmission of the actuation signal pulse, thereby preventing a condition in which two or more of the valve assemblies are open at the same time.

Upon indication that the open, non-selected valve assembly has closed (e.g., termination of the stroke signal pulse), the controller may proceed with transmission of the actuation signal pulse for actuation of the selected valve assembly. In some implementations, the controller may be configured to modify a stored opening delay OD (as described above) of the actuation signal based on the delay resulting from the existing valve open condition. In other implementations, the controller may additionally or alternatively be configured to initiate a passthrough mode (described in greater detail above), thereby eliminating valve control module actuation signal adjustments that may be causing valve assembly open conditions to overlap. In still other implementations, the controller may additionally or alternatively be configured to initiate an emergency shutdown/alert mode discontinuing valve assembly actuation, for example, when the valve open condition exceeds a maximum permissible threshold.

Referring back to FIG. 2A, the exemplary fluid flow control process 1000 may include, after the opening delay OD time has been reached (at 1050), controller polling for a stroke signal from a valve assembly position sensor (e.g., via a digital input connector), at 1060, for indication that a valve assembly is already open. The controller may continue polling for the stroke signal, until no valve assemblies are open (at 1070), before transmitting the actuation signal to the pilot valve (at 1080).

Although the invention has been disclosed and described with respect to certain exemplary embodiments, certain variations and modifications may occur to those skilled in the art upon reading this specification. Any such variations and modifications are within the purview of the invention notwithstanding the defining limitations of the accompanying claims and equivalents thereof. Accordingly, departures may be made from such details without departing from the spirit or scope of the applicant's general inventive concept.

We claim:

1. A method of controlling fluid flow in a fluid system, the fluid system including an actuated valve assembly including an actuator having an actuator member biased towards a normal position and an inlet port configured to receive a pressurized fluid for movement of the actuator member to an actuated position, the method comprising:

receiving a command signal pulse at a valve controller;

in response to receipt of the command signal pulse, after a predetermined opening delay, transmitting an actuation signal pulse from the valve controller to a pilot valve;

in response to receipt of the actuation signal pulse at the pilot valve, actuating the pilot valve to direct pressurized fluid to the actuator inlet port for movement of the actuator member to the actuated position;

in response to movement of the actuator member to the actuated position, transmitting a stroke signal pulse from a position sensor assembled with the valve assembly to the valve controller;

in response to termination of the command signal pulse, after a predetermined closing delay, terminating transmission of the actuation signal pulse to the pilot valve;

in response to termination of the actuation signal pulse, actuating the pilot valve to divert pressurized fluid from the actuator inlet port for biased movement of the actuator member to the normal position;

in response to movement of the actuator member to the normal position, terminating transmission of the stroke signal pulse to the valve controller;

calculating an adjusted predetermined opening delay based on a measured time duration between transmission of the actuation signal pulse and receipt of the stroke signal pulse; and calculating an adjusted predetermined closing delay based on a measured time duration between termination of the actuation signal pulse and termination of the stroke signal pulse.

2. The method of claim 1, wherein receiving the command signal at the valve controller comprises transmitting the command signal from an external computer in communication with the valve controller.

3. The method of claim 1, wherein the predetermined opening delay and the adjusted predetermined opening delay are calculated to maintain a substantially constant total opening time duration between receipt of the command signal pulse and receipt of the stroke signal pulse.

4. The method of claim 1, wherein the predetermined closing delay and the adjusted predetermined closing delay are calculated to maintain a substantially constant total closing time duration between termination of the command signal pulse and termination of the stroke signal pulse.

5. The method of claim 1, further comprising transmitting actuation timing data from the controller to an external computer.

6. The method of claim 1, wherein the fluid system further includes a second valve assembly including a second actuator having a second actuator member biased towards a normal position and a second inlet port configured to receive a pressurized fluid for movement of the second actuator member to an actuated position.

7. The method of claim 6, further comprising delaying transmission of the actuation signal pulse from the valve controller to the pilot valve when the second actuator member is in the actuated position.

8. The method of claim 6, further comprising:

receiving a second command signal pulse at the valve controller;

in response to receipt of the second command signal pulse, after a predetermined second opening delay, transmitting a second actuation signal pulse from the valve controller to a second pilot valve;

in response to receipt of the second actuation signal pulse at the second pilot valve, actuating the second pilot valve to direct pressurized fluid to the second actuator inlet port for movement of the second actuator member to the actuated position;

in response to movement of the second actuator member to the actuated position, transmitting a second stroke signal pulse from a second position sensor assembled with the second valve assembly to the valve controller;

in response to termination of the second command signal pulse, after a predetermined second closing delay, terminating transmission of the second actuation signal pulse to the second pilot valve;

in response to termination of the second actuation signal pulse, actuating the second pilot valve to divert pressurized fluid from the second actuator inlet port for biased movement of the second actuator member to the normal position;

calculating an adjusted predetermined second opening delay based on a measured time duration between transmission of the second actuation signal pulse and receipt of the second stroke signal pulse; and calculating an adjusted predetermined second closing delay based on a measured time duration between termination of the second actuation signal pulse and termination of the second stroke signal pulse.

9. The method of claim 8, wherein receiving the second command signal pulse at the valve controller is simultaneous with termination of the command signal pulse at the valve controller.

10. The method of claim 1, further comprising, in response to receipt of an error signal at the valve controller, entering a passthrough mode in which subsequent command signal pulses bypass the valve controller and are transmitted to the pilot valve.

11. The method of claim 10, wherein entering the passthrough mode comprises operation of a relay switch by the valve controller.

12. The method of claim 1, wherein the position sensor is assembled with the actuator.

13. The method of claim 12, wherein the position sensor is configured to sense a mid-stroke position of the actuator member.

14. The method of claim 1, wherein the valve assembly includes a valve element movable between a closed position blocking flow between inlet and outlet ports of the valve assembly and an open position permitting flow between the inlet and outlet ports.

15. The method of claim 14, wherein the normal position of the actuator member corresponds to the closed position of the valve element and the actuated position of the actuator member corresponds to the open position of the valve element.

16. A fluid supply system comprising:

at least one actuated valve assembly including:

an actuator having an actuator member biased towards a normal position; and a pilot valve connected with an inlet port of the actuator and configured to be operated between a first configuration supplying pressurized fluid to the actuator inlet port for movement of the actuator member to an actuated position and a second configuration diverting pressurized fluid from the actuator inlet port for biased movement of the actuator member to the normal position;

a valve control module including a valve controller configured to receive a command signal pulse and transmit an actuation signal pulse from the valve controller to the pilot valve for actuation of the pilot valve to the first configuration after a predetermined opening delay stored in the valve controller, for corresponding movement of the actuator member to the actuated position; and at least one position sensor assembled with the at least one valve assembly and configured to transmit a stroke signal pulse to the valve controller in response to movement of the actuator member to the actuated position;

wherein the valve controller is configured to calculate an adjusted predetermined opening delay based on a measured time duration between transmission of the actuation signal pulse and receipt of the stroke signal pulse, the valve controller being configured to replace the predetermined opening delay with the adjusted predetermined opening delay;

wherein the valve controller is configured to terminate transmission of the actuation signal pulse to the pilot valve in response to termination of the command signal pulse, after a predetermined closing delay, and wherein the pilot valve is configured to actuate to the second configuration in response to termination of the actuation signal pulse to divert pressurized fluid from the actuator inlet port for biased movement of the actuator member to the normal position, terminating transmission of the stroke signal pulse to the valve controller; and wherein the valve controller is configured to calculate an adjusted predetermined closing delay based on a measured time duration between termination of the actuation signal pulse and termination of the stroke signal pulse.

17. The fluid supply system of claim 16, wherein the adjusted predetermined closing delay is calculated to maintain a substantially constant total closing time between termination of the command signal pulse and termination of the stroke signal pulse.

18. The fluid supply system of claim 16, further comprising an external device configured to transmit the command signal pulse to the valve controller.

19. The fluid supply system of claim 16, wherein the adjusted predetermined opening delay is calculated to maintain a substantially constant total opening time between receipt of the command signal pulse and receipt of the stroke signal pulse.

20. The fluid supply system of claim 16, wherein the position sensor is assembled with the actuator.

\*　\*　\*　\*　\*